(12) United States Patent
Drobnitzky et al.

(10) Patent No.: US 11,255,944 B2
(45) Date of Patent: Feb. 22, 2022

(54) METHOD FOR ASCERTAINING A DEVIATION OF AT LEAST ONE GRADIENT FIELD FROM A REFERENCE

(71) Applicant: Siemens Healthcare GmbH, Erlangen (DE)

(72) Inventors: Matthias Drobnitzky, Spardorf (DE); Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/066,763

(22) Filed: Oct. 9, 2020

(65) Prior Publication Data
US 2021/0124004 A1  Apr. 29, 2021

(30) Foreign Application Priority Data
Oct. 28, 2019 (DE) .......................... 102019216559.1

(51) Int. Cl.
*G01R 33/565* (2006.01)
*G01R 33/563* (2006.01)
*G01R 33/385* (2006.01)

(52) U.S. Cl.
CPC ..... *G01R 33/56572* (2013.01); *G01R 33/385* (2013.01); *G01R 33/56341* (2013.01)

(58) Field of Classification Search
CPC ........ G01R 33/56572; G01R 33/56341; G01R 33/385
See application file for complete search history.

(56) References Cited

U.S. PATENT DOCUMENTS

| 5,539,310 | A | * | 7/1996 | Basser | ............. | G01R 33/56341 |
| | | | | | | 324/307 |
| 5,886,524 | A | | 3/1999 | Krieg | | |
| 2004/0113615 | A1 | * | 6/2004 | Bammer | .......... | G01R 33/56341 |
| | | | | | | 324/307 |
| 2012/0068699 | A1 | * | 3/2012 | Horkay | .................. | A61B 5/418 |
| | | | | | | 324/300 |

OTHER PUBLICATIONS

Finsterbusch, Jurgen. "Eddy-current compensated diffusion weighting with a single refocusing RF pulse." Magnetic Resonance in Medicine: An Official Journal of the International Society for Magnetic Resonance in Medicine 61.3 (2009): 748-754.

(Continued)

*Primary Examiner* — G. M. A Hyder
(74) *Attorney, Agent, or Firm* — Lempia Summerfield Katz LLC

(57) ABSTRACT

The disclosure relates to a method for ascertaining a deviation of at least one gradient field of a magnetic resonance system from a reference. The method includes providing at least one first image data set and one second image data set of a phantom with isotropic diffusion properties, recorded with a diffusion-weighted imaging sequence, wherein the first image data set and the second image data set are recorded with different diffusion-weightings along a gradient direction to be tested of the gradient field using the magnetic resonance system. The method further includes ascertaining a map of apparent diffusion coefficients from the image data sets for at least a portion of the image points of the image data sets. The method further includes comparing the apparent diffusion coefficients with the reference.

17 Claims, 6 Drawing Sheets

(56) References Cited

OTHER PUBLICATIONS

German Office Action for German Application No. 10 2019 216 559.1 dated Sep. 8, 2020.
Moreau, Bastien, et al. "How reliable are ADC measurements? A phantom and clinical study of cervical lymph nodes." European radiology 28.8 (2018): 3362-3371.

* cited by examiner

METHOD FOR ASCERTAINING A DEVIATION OF AT LEAST ONE GRADIENT FIELD FROM A REFERENCE

The present patent document claims the benefit of German Patent Application No. 10 2019 216 559.1, filed Oct. 28, 2019, which is hereby incorporated by reference.

TECHNICAL FIELD

The disclosure relates to a method for ascertaining a deviation of at least one gradient field of a magnetic resonance system from a reference. The disclosure also relates to a computer program product, a data carrier, and a magnetic resonance system, with which the aforementioned method is executable.

BACKGROUND

One of the central therapy methods for a cancer is radiotherapy, also known as radiation therapy. Thereby, a particle beam is delivered to the tumor tissue. The radiation damages the genetic material of the cancer cells such that the cell division is prevented. Healthy tissue has a greater regenerative capacity than cancer tissue. Therefore a radiation therapy is subdivided into a plurality of sessions to give the healthy tissue the opportunity to recover. In order to reduce the number of radiation therapy sessions, it is known to undertake a so-called precision irradiation. Thereby, such a high dose is administered that healthy tissue would also be irreversibly damaged. With precision irradiation, in order to protect the healthy tissue, it is therefore of fundamental importance to determine the position of the cancer tissue exactly before the application of the precision irradiation.

All the medical imaging processes are suitable, in principle, for position determination. Magnetic resonance imaging offers the advantage, however, of not introducing any additional radiation and of having good soft tissue contrast, even without the administration of contrast medium. The resolution achieved is sufficient for an exact localization of the cancer tissue.

In magnetic resonance imaging, apart from a main magnetic field $B_0$, a plurality of gradient fields are also used. The gradient fields generate a position-dependency of the Larmor frequency of the spins, whereby a position encoding of the reception signal may be achieved. The magnetic resonance system configured for imaging may have three gradient coils for generating three gradient fields. These are perpendicular to one another in order to enable a position encoding in all spatial directions.

In theoretical considerations of position encoding, the gradients are assumed to be linear throughout. In practice, however, they are nonlinear at least in the edge regions and their slope is flattened. This has several advantages, for example, undesirable stimulations are prevented, and the inductance of the gradient coil is reduced, which enables more rapid switching processes in order to achieve short echo times and repetition times.

The non-linearity leads to a distortion in the reconstruction, although this may be compensated for by a distortion correction if the gradient field shape, that is, the non-linearity, is known.

Because the image data sets of a magnetic resonance system allow exact position determination in the context of a precision irradiation, it is necessary to monitor the gradient field shape during the use of the magnetic resonance system. In particular, in the non-linear region, deviations from the original values may arise over time.

In known methods, an MR phantom which has an evenly configured internal structure is used. Such an MR phantom includes a carrier of a non-MR resonant material. The carrier is therefore invisible in MR images. Arranged within it at regular spacings are cylindrical hollow bodies filled with water. These hollow bodies have a diameter and a length of approximately 0.5 cm.

The production of such an MR phantom is in itself complex. The evaluation of the image data generated therewith is also time-consuming and requires expertise, because the non-linearities that are present are tested for deviations.

SUMMARY AND DESCRIPTION

It is therefore an object of the present disclosure to provide a method for ascertaining the temporal stability of at least one gradient field of a magnetic resonance system which allows easier execution.

The scope of the present disclosure is defined solely by the appended claims and is not affected to any degree by the statements within this summary. The present embodiments may obviate one or more of the drawbacks or limitations in the related art.

This object is achieved with a method for ascertaining a deviation of at least one gradient field of a magnetic resonance system from a reference. The method includes providing at least one first and one second image data set of a phantom with isotropic diffusion properties, recorded with a diffusion-weighted imaging sequence, wherein the first image data set and the second image data set are recorded with different diffusion-weightings along a gradient direction to be tested of the gradient field using the magnetic resonance system. The method further includes ascertaining a map of apparent diffusion coefficients from the image data sets for at least a portion of the image points of the image data sets. The method further includes comparing the apparent diffusion coefficients with reference values.

The disclosure relates to creating from an isotropic diffusion phantom a map of apparent diffusion coefficients (abbreviated to ADC) in order, on the basis thereof, to test the gradient field or gradient fields for constancy. Such MR phantoms do not require an inner structure of known geometry, but rather are realizable with simple, unstructured fluid-filled hollow spheres.

The disclosure aims to detect a change in the gradient fields of the magnetic resonance system which may occur over time. Advantageously, the method is therefore repeated every 1-12 months, for example. If a significant deviation of the apparent diffusion coefficient from the reference values is detected, correction measures may be taken. If the non-linearity of the gradient fields—or their change—is known, the distortion correction measures may be adapted accordingly in the context of the image reconstruction. Corrections to the gradient coils may also possibly be made. In this way, the continuing validity of distortion correction measures used, and the precision of calculated MR images are provided.

A reference for a gradient field which is currently present on the magnetic resonance system may be the gradient field under investigation that was measured at an earlier time point. This serves as a reference and may be stored as a characteristic field. Due to ageing processes, the gradient field may deviate over time from the reference, that is, its original values.

For the recording of the image data sets, a diffusion-weighted sequence is used, for example, a DW-SE or a DW-EPI. DW stands for diffusion-weighted, SE for a spin-echo sequence, and EPI for echo planar imaging. In principle, each sequence with which a diffusion weighting is achieved may be used.

The two image data sets have a different diffusion weighting. A diffusion weighting is a diffusion-caused signal attenuation in an image data set.

The signal attenuation is given by:

$$S=S_0*\exp(-b*ADC)$$

Here, S is the diffusion-weighted signal, $S_0$ is the unweighted signal, exp is the exponential function, b is the so-called b-value, and ADC is the apparent diffusion coefficient.

The b-value, also called b-factor or diffusion factor, is a measure for the diffusion weighting. It is found via the wave number k $$K(t)=\int gG(t')dt',$$

Here, G is the gradient field strength of the (diffusion) gradient. Thereby, the same value is used, even if smaller gradient values are present in the edge regions, as described.

The wave number k leads to the b-value as follows $$b=\int k^2(t)dt.$$

The apparent diffusion coefficient ADC is then given by $$ADC=-\ln(S/S0)/b$$

If a plurality of image data sets with different b-values exist, value pairs are obtained from which by a fit, the apparent diffusion coefficient is ascertainable. If only two data sets exist, the apparent diffusion coefficient is found directly from:

$$ADC=-\ln(S_2/S_1)/(b_2-b_1).$$

Thereby, $S_1$ is the signal intensity of the associated b-value $b_1$ and $S_2$ is the signal intensity of the associated b-value $b_2$, each for a corresponding image element of the image data sets. The image data sets are selected so that $b_2$ is the larger b-value.

The isotropic diffusion properties of the phantom may be achieved in that it contains a fluid, in particular a liquid and has no internal structures. In particular, the phantom exclusively contains the fluid in its interior. In other words, the phantom may be solid body-free in its interior. The shell of the phantom may be formed in any shape. In an embodiment, the phantom is spherical. Alternatively, the phantom may be configured cubic. Further alternatively, the phantom may be configured cylindrical. The wall of the phantom is made of an MR-compatible material, in particular, of non-magnetic material. Furthermore, the wall may be made of a solid body which generates no signal during imaging. The wall of the phantom may be made of glass or Plexiglas. The fluid in the interior of the phantom may be a liquid. The liquid may be a pure substance. The liquid, (e.g., water), may still contain solid components, (e.g., minerals in mains water). However, it contains no other liquids or fluids. Alternatively, the liquid may be a mixture, in particular, a homogeneous mixture. It is then a mixture of at least two fluids, in particular, liquids. In one embodiment, the liquid may be mixed with a relaxation agent. This may be a relaxation agent for reducing the T1 relaxation time. The scan time may then be shortened. In the case of a spherical or cylindrical shape, the phantom may have a diameter of at least 20 cm, at least 30 cm, or at least 40 cm. In the case of a cylindrical or cuboid configuration, the length may be at least 20 cm, at least 30 cm, or at least 40 cm.

A different diffusion weighting in the imaging is obtained as soon as a parameter of the sequence used that influences the b-value is changed.

A gradient coil generates a gradient field in each case. This is also designated a magnetic field gradient field or a magnetic field gradient. A gradient field generates a location-dependent magnetic field strength. In a pictorial representation, this corresponds to a wedge shape, wherein the magnetic field strength is proportional to the steepness of the wedge. In the case of non-linear gradients, the wedges are correspondingly flattened.

A magnetic resonance system configured for imaging may have three gradient coils for generating three gradient fields. The gradient fields that may be generated are arranged perpendicular to one another. Their directions are distinguished, by definition, as x-, y-, and z-directions. They are defined spatially fixed. In the present disclosure, they are designated $G_x$, $G_y$, and $G_z$.

The spatial variation of those components of the generated magnetic field which extends parallel to the direction of the main magnetic field $B_0$ is designated the gradient. This direction of the main magnetic field $B_0$ is, as generally defined, the z-direction.

If, therefore, the main magnetic field $B_0$ is oriented along the z-axis, then a so-called x-gradient generates a magnetic field along the z-axis which may change linearly dependent upon the spatial position along the x-axis. In the isocenter of the magnet, the amplitude of the generated field may be zero. Accordingly, there is a y-gradient and a z-gradient.

To be distinguished therefrom are the gradients used in the context of a sequence in the reading direction, phase encoding direction and slice selection direction, which are designated $G_r$, $G_p$, and $G_s$. They are also orthogonal to one another, but in comparison with the x-y-z coordinate system, they are in principle arbitrarily arranged. For their generation, the gradients $G_x$, $G_y$, and $G_z$ may be added together. Solely in the event that the directions x, y, and z are each arranged parallel to one of the directions r, p and s, only one of the gradients $G_x$, $G_y$, or $G_z$ is used as a gradient in the reading direction, exclusively a second of the gradients $G_x$, $G_y$, or $G_z$ is used in the phase encoding direction and exclusively the third of the gradients $G_x$, $G_y$, or $G_z$ is used in the slice selection direction.

Advantageously, the x-, y-, or z-direction is measured directly and thus the directions r, p, and s are each arranged parallel to one of the directions x, y, and z. In other words, the gradient direction to be tested may be the x-, y-, or z-direction. Then the ascertained diffusion coefficients may be directly assigned to a gradient direction. In this embodiment, exactly one gradient field is monitored for deviations.

Alternatively, however, combinations of gradient fields may also be investigated. Then the readout direction may lie, for example, between the x- and y-directions. In this embodiment, at least two gradient fields, in particular, exactly two gradient fields or exactly three gradient fields may be monitored for deviations.

It will now be described how exactly one gradient field is monitored for deviations. Monitoring of two or three gradient fields simultaneously results from a corresponding rotation of the image data sets relative to the x-, y-, and z-axis.

An apparent diffusion coefficient is ascertainable for each image element or volume element of the diffusion-weighted image data sets. For the image elements which have only a noise signal but are without significance, a threshold value may be set and only an apparent diffusion coefficient is ascertained or indicated for those image elements for which the signal strength exceeds the threshold value. Then, sometimes apparent diffusion coefficients are ascertained only for a portion of the image elements, even if each image element which maps the phantom has been taken into account. The representation of the ascertained apparent diffusion coefficients is designated a map.

In order to obtain a reference point regarding a deviation, the apparent diffusion coefficients are compared with reference values. The comparison is also to be adapted dependent upon the type of the reference values. On the basis of the comparison result, a measure for the deviation is ascertained. The different possibilities for reference values and the corresponding deviation measures are considered again below.

A deviation thus results therefrom that two scans at different time points are compared with one another. The reference maps or reference values have been acquired with a gradient field that is regarded as a reference. If the currently recorded maps match the reference maps, it is assumed that the currently applied gradient field matches the gradient field that is regarded as a reference. Because the measurement data is noise-laden, it is ascertained which differences are regarded as caused exclusively by noise and from when a deviation of the gradient field is recognized.

On the basis of the comparison, independently of the exact configuration of the criteria, it is decided at the end whether the deviation of the gradient field adheres to a predetermined measure or not. In the first case, the magnetic resonance system may be further used for precision irradiation. Otherwise, the gradient field strengths are ascertained anew in order to achieve the desired accuracy in the spatial resolution.

Therefore, based on the comparison, a classification of the gradient field may be undertaken. The deviation is then qualified and not quantified. For example, the deviation may be qualified as "sufficiently small" or "too large". In the first case, the system values of the magnetic resonance system, for example, the gradient coil currents to be adjusted, are further used. In the second case, the gradient field or fields are measured again.

The reference from which the gradient field deviates may also be designated the reference gradient field. What is concerned is, in particular, values of the gradient field which were measured or calculated at an earlier time point, in particular, during commissioning of the magnetic resonance system.

The method described offers a plurality of advantages. For example, the apparent diffusion coefficients are numerical values which are more or less independent of signal intensities. A comparison of reference values is therefore easier and also performable automatically. With the use of a phantom having isotropic diffusion properties, both the manufacturing and also the placement of the phantom are simplified. In this way, the monitoring measurements may also be carried out by clinical personnel. Only when a deviation of a gradient field exceeds a predetermined limit does the manufacturer of the magnetic resonance system take action for a new measurement of the gradient field.

The image data sets are naturally recorded on the magnetic resonance system, the gradient fields of which are to be checked for deviations. The evaluation of the image data sets may take place on any computer. Because the checking of the gradient fields takes place only at relatively large intervals, it is conceivable, in particular, to keep the relevant evaluating software only on individual central computers, in particular, cloud computers of the manufacturer of the magnetic resonance system.

The image data sets may be available and/or be transferred either as raw data sets, reconstructed data sets or in a general exchange format, e.g., in DICOM (Digital Imaging and Communications in Medicine) format. Thereby, the b-values may also be stated directly or may be ascertainable from the sequence protocol. Corresponding time and gradient strength details are then known.

In the ascertaining of the apparent diffusion coefficients which may be calculated image element-wise, the same b-value is used. Thereby, the b-value may be defined starting from a linear gradient field. It is possible, in principle, to calculate a separate b-value for every image element taking account of the non-linearities. However, the effort involved is not worthwhile because the apparent diffusion coefficient may work out the same for each image element due to the isotropy of the phantom and the differences in the apparent diffusion coefficients are then directly attributable to the differences in the gradient field. Deviations are recognized through the comparison with the reference values. This procedure significantly simplifies the evaluation.

The method described is aimed at establishing changes in the gradient non-linearities over time. The recorded ADC maps at a first time point A therefore serve as a reference and are compared with ADC maps at a later time point B.

In the imaging, gradient non-linearities ascertained at the time point A are used in order to correct geometric image distortions. The method described permits it to be established whether over time the necessity exists for adapting correction parameters.

In the selection of the phantom and/or the parameterizing of the sequence, it may be noted that the diffusion properties of the imaging substance permit a reliable evaluation of the recorded ADC maps.

Differently expressed, the diffusion coefficient lies within the correct order of magnitude and is not too small or too large. If the diffusion coefficient is too large, the signal decays very rapidly even at small b-values. If the signal already decays to the noise level of the scan even at b-values of a few 10 s/mm$^2$, then the ADC cannot be usefully evaluated. If, however, the diffusion coefficient is too small, the signal itself does not decay significantly, even at large b-values. If the signal does not decay appreciably even at b-values of a few 1000 s/mm$^2$, then the ADC again cannot be usefully evaluated. The diffusion behavior may be defined through the selection of the fluid.

Originally, a diffusion coefficient which is changed on the basis of microscopic spatial limitations may be designated an apparent diffusion coefficient (ADC). This designation is now also used for other influences on the diffusion coefficient. In the present case, the non-linearity of the gradient field influences the diffusion coefficient.

A locally acting deviation of the gradient from the linearity causes a local deviation of the b-value intended per diffusion weighting, and thereby, a signal change encoded at this location in the image data sets, which becomes apparent as a changed ADC value in the ADC maps.

The diffusion-weighted image data sets which are provided for a gradient direction may have the same resolution and/or the same field of view and/or the same number of image elements. If all the parameters except for the diffusion weighting are identical, the evaluation is easier. Otherwise, the signal intensity values are converted.

The diffusion-weighting may be maintained by diffusion gradients along the gradient direction that is to be tested. The gradient directions may be the x-, y-, or z-direction mentioned above. A gradient in one of these directions brings about a changed magnetic field strength in this direction. The gradient coil for the z-direction, hereinafter called the z-coil, thus generates a magnetic field strength which is formed rising or falling in the z-direction and is accordingly a gradient field. In the x- and y-direction, however, the field is substantially constant.

A diffusion gradient in this direction is thus, in this example, a gradient switched in the z-direction in a sequence. The gradient may lie, in the sequence, in the readout direction $G_r$, in the phase encoding direction $G_p$ or the slice selection direction $G_s$. In other words, its function conforms to the position of the image data set.

At least with 2D image data sets, one of the position encoding directions may lie in the direction of the gradient direction that is to be tested. Advantageously, the readout direction $G_r$ may lie in the direction of the gradient direction that is to be tested. Alternatively, the phase encoding direction $G_p$ may lie in the direction of the gradient direction that is to be tested. Then the diffusion gradients lie not only in the z-direction but, from the "viewpoint" of the sequence, also in the readout direction $G_r$ and/or in the phase encoding direction $G_p$.

In the case of a 3D image data set, all the gradient directions may also be position encoding directions. The readout direction $G_r$ may then lie in the direction of the gradient direction that is to be tested. In this direction, an increase in the resolution is possible without time loss. Because, in the problem in question, this is also the direction in which the greatest resolution is desired, it is the most time-saving variant both for 2D image data sets and also for 3D image data sets.

Then, the diffusion gradients may also lie in the readout direction $G_r$. This results, as discussed, in minimum scanning durations.

Alternatively, the diffusion gradients lie in the phase encoding direction $G_p$.

One direction of the groups of readout direction or phase encoding direction may lie in the direction of the gradient direction to be tested and the other direction of the group lies so that the "wedge" generated by the gradient field is cut through in the longitudinal direction.

The method (or certain acts of the method) may be repeated for a second and/or third gradient direction. If, firstly, image data sets are recorded for the z-direction, the entirety is repeated for the x- and/or the y-direction. For each gradient direction, a unique map of apparent diffusion coefficients, each to be compared with unique reference values, is obtained. This also applies if gradient directions other than the x-direction, the y-direction or the z-direction are monitored.

One of the image data sets may be recorded with a b-value in a range of 100 s/mm$^2$ and 2000 s/mm$^2$, in a range of 1000 s/mm$^2$ and 2000 s/mm$^2$, or in a range of 1500 s/mm$^2$ and 2000 s/mm$^2$. These b-values may result without taking account of the imaging gradients, that is, purely from the diffusion gradients.

In order to achieve the greatest possible difference, it may be provided that one of the image data sets may be recorded with a b-value of less than 50 s/mm$^2$, or less than 25 s/mm$^2$. Furthermore, one of the image data sets may be recorded with a b-value of 0 s/mm$^2$. Here also, the b-values may result without taking account of the imaging gradients, that is, purely from the diffusion gradients. With a b-value of 0, it is necessary and with the other values, optional.

A diffusion weighting may therefore also include therein that during the recording of one of the image data sets, no diffusion gradients are to be used. If the imaging gradients are ignored, b=0 is obtained as the b-value.

Ultimately, in the selection of the b-values, what is important is obtaining as great a signal difference as possible. Of decisive importance is not the absolute value, but the difference of the b-values. Thus, the first image data set with a b-value may be recorded, which differs by at least 100 s/mm$^2$ from the b-value of the second image data set. The b-value may differ by more than 500 s/mm$^2$, by more than 1000 s/mm$^2$, by more than 1500 s/mm$^2$, or by more than 2000 s/mm$^2$.

If more than two image data sets are used for one gradient direction, either correspondingly smaller intermediate values may occur or the spacings apply in each case between two image data sets.

Advantageously, in the imaging sequence, the diffusion gradients may be arranged symmetrically round a refocusing pulse. The gradient fields used for the diffusion encoding, which arise when the gradients are applied, in this case the diffusion gradients, contain transverse components. These transverse components are found from Maxwell's equations. A symmetrical diffusion encoding, in particular a Stejskal-Tanner encoding, helps in the avoidance of the transverse components.

A Stejskal-Tanner encoding includes an excitation pulse, a diffusion gradient, a refocusing pulse, an identical diffusion gradient and the data recording. If imaging gradients are repeatedly added thereto, and the sequence is repeated with changing phase encodings, a so-called diffusion-weighted spin echo DW-SE is obtained. Here also, one of the diffusion weightings may include an omission of the diffusion gradients.

Alternatively, rather than the individual readout, an EPI echo train may follow. This sequence is known under the abbreviation DW-EPI (diffusion-weighted echo planar imaging). DW-EPI also uses a Stejskal-Tanner encoding.

During the Stejskal-Tanner encoding, assuming perpendicular gradient ramps, the b-value is found from:

$$b=g^2G^2d^2(D-d/3)$$

Here, g is the gyromagnetic ratio of the nucleus under investigation, G is the strength of the diffusion gradient, d is the duration of the diffusion gradient, and D is the spacing of the diffusion gradient. This applies both for the DW-SE and also the DW-EPI sequence if only the diffusion gradients are taken into account.

The diffusion gradient may be configured eddy current-compensated. The diffusion gradients may generate eddy currents. In order to prevent this, the diffusion gradients may be configured or arranged eddy current-compensated. In order to achieve this, different possibilities exist which may be used individually or in combination:

In an embodiment, the diffusion gradients may be arranged bipolar. However, the b-value achievable thereby is reduced.

Alternatively, the gradient durations of the diffusion gradients may be extended, and the gradient strengths may be reduced, whereby the b-value may remain preserved.

In an embodiment, eddy current correction methods may be used in the reconstruction of the image data sets.

Furthermore, two identical image data sets may be recorded, wherein only the polarity of the diffusion gradients is swapped. This does not influence the intended signal reduction, because the b-values are each identical. However, the eddy current-related distortions are inverted and may then be subtracted out.

Overall, at least three raw data sets may then be acquired, or image data sets may be provided, whereby in a portion of the image data sets, a polarity of the diffusion gradients is swapped.

Furthermore, the imaging sequence for recording the raw data sets may have an excitation pulse and a refocusing pulse, wherein the slice thickness of the excited magnetization during the refocusing pulse is greater than the slice thickness of the excitation pulse. These are present, for example, both in the DW-SE described and also in the DW-EPI. Eddy currents at this point also lead to a displacement of the slices. A displaced slice of the refocusing pulse then leads to signal losses, because the refocusing pulse refocuses only a portion of the slice. This may be compensated for by increasing the slice thickness of the refocusing pulse as compared with the excitation pulse.

In another embodiment, 3D imaging may be used. The effects are as described in relation to the increased slice thickness of the refocusing pulse.

At least four image data sets may be prepared, wherein in a portion of the image data sets, the directions of the phase encoding gradient and of the readout gradient are swapped. In this way, effects may be recognized by the imaging gradients and compensated for.

The ascertained maps of apparent diffusion coefficients are to be compared with reference values. This may be achieved in a plurality of ways.

The reference values at an earlier time point may be diffusion coefficients recorded at an earlier time point with the magnetic resonance system, e.g., with the method according to one of the preceding claims. Then, given the same position in the magnetic resonance system, the diffusion coefficient values may correspond when no deviations are present.

ADC maps recorded at different times with the same phantom construction may be used as testing methods for the constancy of the gradient field, in particular, the gradient non-linearity in that the change of the signal intensity in the ADC maps is analyzed.

In an embodiment, the diffusion coefficients may then be compared pixel for pixel, that is image element-wise. This may take place with the generation of a difference image.

Thereby, due to the noise, each image element will have a slight deviation. Then two threshold values are provided: a first threshold value which defines which difference is regarded as the deviation; and a second threshold value which defines what number of deviations is allowed. If the second threshold value is exceeded, the gradient field investigated is to be measured anew.

Instead thereof, the total of the deviations may also be ascertained, and this total may be compared with a threshold value.

It has been found, however, that the boundary conditions are not always constant, even if the gradient fields have no deviations. Therefore, advantageous developments have been found to adapt the evaluation to changeable boundary conditions:

The maps of the apparent diffusion coefficients and the reference values may be normalized. The normalization may take place at a defined location, for example, the isocenter of the magnetic resonance system. Thereby, the diffusion coefficient values may be divided by a diffusion coefficient at the defined location. A percentage value as compared with the center point is then obtained. Thereby, displacements of the apparent diffusion coefficient may be compensated for, in particular, by temperature differences.

Furthermore, the noise signal may be so disruptive that the setting of a threshold value does not function reliably.

Then a spatial filter, in particular a Gaussian filter, may be used.

Alternatively, or in addition to a filter, the maps of the apparent diffusion coefficients may be fitted. For example, an x-gradient extends such that the z-component of the magnetic field generated changes linearly as a function of the position along the x-axis. Non-linearities lead thereto that the change along the x-axis takes place non-linearly. Furthermore, additional changes in the generated magnetic field may occur dependent upon the position along the y- and z-axis. The fit may take account of the complete expected geometry, that is, also the deviations along the transverse directions. Fitting may refer to, in particular, that a predetermined model function such as a two or three-dimensional function, (e.g., a spherical surface function), is fitted to the apparent diffusion coefficients in order to obtain fitted apparent diffusion coefficients. This represents a type of averaging which also leads to a noise reduction.

Alternatively, for each column the values of which are to be constant, a mean value may be calculated. This direction is perpendicular to the non-linearity. In a 3D data set, these are in fact two directions. This is a very easily implemented averaging method in which, however, the spatial resolution becomes lost.

Rather than measuring the reference values, they may also be calculated. This presupposes an exact knowledge of all the necessary variables. It is to be shown that the calculations are correct because the recording of maps of apparent diffusion coefficients for comparison is also necessary. If no further settings or monitoring is dependent upon the calculations, it is more efficient not to calculate the values at first. The calculation would however have the advantage that the correction values for compensation of the deviations would be known directly.

Furthermore, the main field $B_0$ may be inhomogeneous. Then, either the measurement may be restricted to the homogeneous region or it may be monitored that the inhomogeneity is constant. Then it changes the b-values constantly.

Provided the effects influencing the ADC value are temporally stable, they play no part in the ascertaining of the temporal instability of gradient non-linearities.

In principle, some of the aforementioned effects also have an influence on the geometric mapping fidelity. Thereafter, the proposed measurement method may be taken into account as an "integral" method for ascertaining the temporal instability of the mapping fidelity, which takes account not only of changes in the gradient non-linearity. In this case, no correction measures have to be taken, because the effects are the same and thus also the reference is correspondingly configured.

The achievement of the object mentioned in the introduction is also obtained with a computer program product, in particular, an item of software which may be loaded into a memory store of a programmable control apparatus or a computer unit. The control apparatus may be arranged in a desktop computer or a cloud server when image data sets provided are evaluated. If the data acquisition is also to be carried out, the control apparatus may be arranged as part of a magnetic resonance system and control an image generating unit of the magnetic resonance system. The control apparatus is used in both cases to carry out an embodiment of the aforementioned method.

The present disclosure further provides a computer program product which may be loaded into a memory store of a programmable control apparatus and/or a computer unit of a magnetic resonance system. With this computer program product, all or various of the above-described embodiments of the method may be carried out when the computer program product runs in the control apparatus. Thereby, the computer program product possibly requires program modules or components, e.g. libraries and auxiliary functions in order to realize the corresponding embodiments of the method. In other words, with the claim directed to the computer program product, in particular, an item of software is to be protected with which one of the above-described embodiments of the method may be carried out or which carries out this embodiment. Thereby, the software may be a source code (e.g. C++) which is still compiled and linked or only interpreted, or is an executable software code which, for execution, need only be loaded into the corresponding computer unit or control apparatus.

In addition, the disclosure relates to a data carrier for a control apparatus for controlling a computer, in particular a data generating unit of a magnetic resonance system and/or an evaluating unit, with data for carrying out the method described. Advantageously, the data generating unit may be an image generating unit. The evaluating unit may be a constituent part of the magnetic resonance system or an external unit. Then the data carrier may also be a constantly accessible memory store of the magnetic resonance system. For this, it does not have to be built into the control apparatus of the magnetic resonance system and it may also be configured as a storage service or a cloud server.

The disclosure also relates to a magnetic resonance system with a control apparatus. The magnetic resonance system is distinguished in that the control apparatus for carrying out the method is configured as described.

The implementation of the aforementioned method in the control apparatus may take place as software or as (hard-wired) hardware.

Further advantageous embodiments of the magnetic resonance system correspond to suitable embodiments of the method. For the avoidance of unnecessary repetition, therefore, reference is made to the corresponding method features and their advantages.

BRIEF DESCRIPTION OF THE DRAWINGS

Further advantages, features, and peculiarities of the present disclosure are disclosed in the following description of exemplary embodiments.

DETAILED DESCRIPTION

Figure 1:
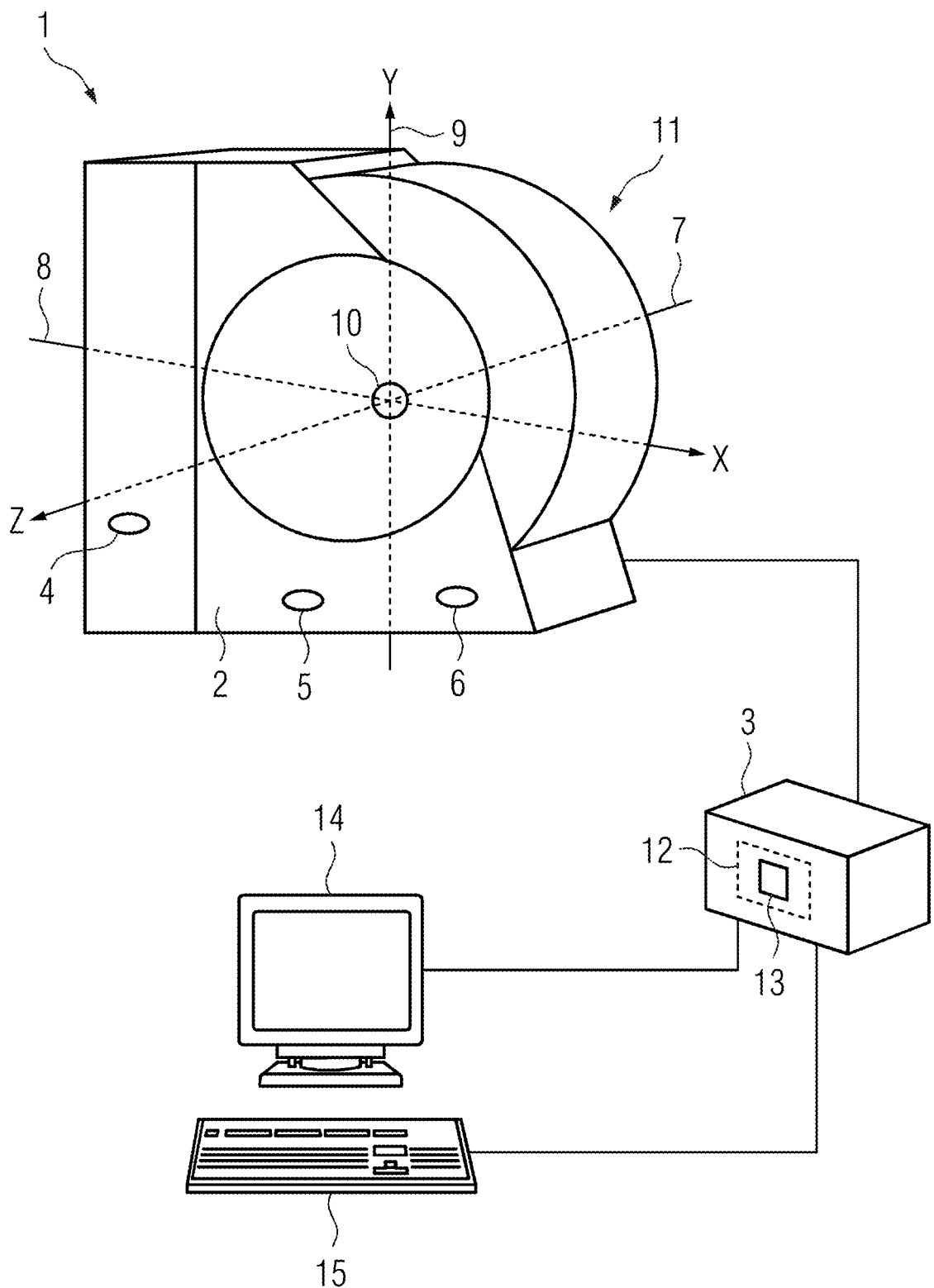
FIG. 1 depicts an example of a magnetic resonance system.

FIG. 1 depicts a magnetic resonance system 1 with a scanner 2 and a control apparatus 3. Three gradient coils 4, 5, and 6 are provided in the scanner 2. The gradient coil 4 generates, for example, a gradient field in the z-direction shown by the z-axis 7 which lies parallel to the axis of the $B_0$ field. The second gradient coil 5 generates a gradient field in the direction of the x-axis 8. This direction is also called the x-direction. The third gradient coil 6 generates a gradient field in the y-direction, shown by the y-axis 9.

The intersection of the axes 7 to 9 is called the origin 10 of the gradient system. The axes 7 to 9 thereby generate the device coordinate system 11. This is not identical to the gradient coordinate system of a sequence as described in the introduction, because the alignment or the readout direction is arranged arbitrarily in space.

The designation of the directions is a pure convention, and they are, in principle, arbitrarily identifiable.

The origin 10 may match the isocenter of the magnetic resonance system but does not have to.

The control apparatus 3 of the magnetic resonance system 1 may have a data carrier 12 on which a computer program product 13 for carrying out the described method is stored.

The control apparatus may have a monitor 14 as the output device and a keyboard 15 as the input unit.

Further common components of the magnetic resonance system such as a transmitting coil arrangement, a receiving coil arrangement, a patient support, etc. are not shown for the sake of clarity.

The transmitting coil arrangement may be configured as a body coil. However, it may also be a transmitting coil array.

A coil array may be used as a receiving coil arrangement. With a coil array, the scan time may then be shortened.

Figure 2:
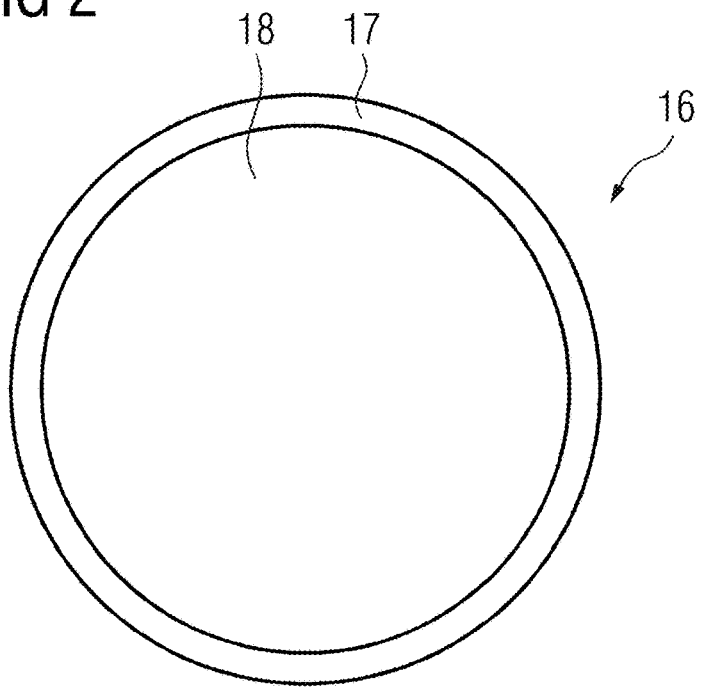
FIG. 2 depicts a phantom in a first embodiment.

FIG. 2 depicts a phantom 16 in a first embodiment in cross-section. It is configured spherical and has a wall 17. Exclusively a liquid 18 is arranged as the material within the wall 17. Where relevant, air may collect at the upper side of the phantom 16, for example, because small quantities of the liquid 18 emerge from the phantom 16. Nevertheless, the liquid 18 is the only liquid and there may also be no solid body situated within the wall 17.

Accordingly, the phantom 16 has isotropic diffusion properties in all directions.

The liquid 18 may be water. It may be mains water or distilled water. The water may have a relaxation agent added. By this, the T1 relaxation time is reduced, whereby the scan time may be shortened.

Alternatively, the liquid may be an oil. This liquid (e.g., oil) may also be mixed with a relaxation agent.

Figure 3:
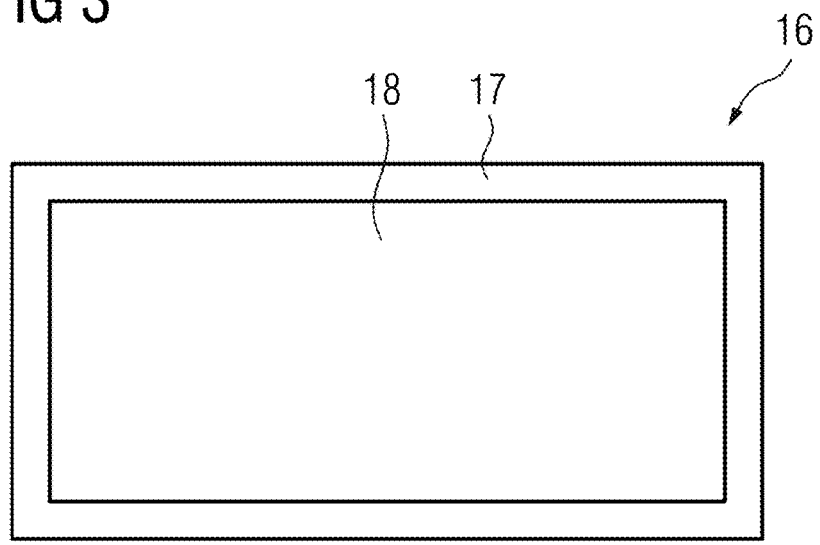
FIG. 3 depicts a phantom in a second embodiment.

FIG. 3 depicts, in cross-section, an alternative embodiment of a phantom 16. In this case, only the shape of the wall 17 is cuboid. Otherwise, the statements relating to FIG. 2 apply. The overall shape may be cylindrical or cuboid.

Figure 4:
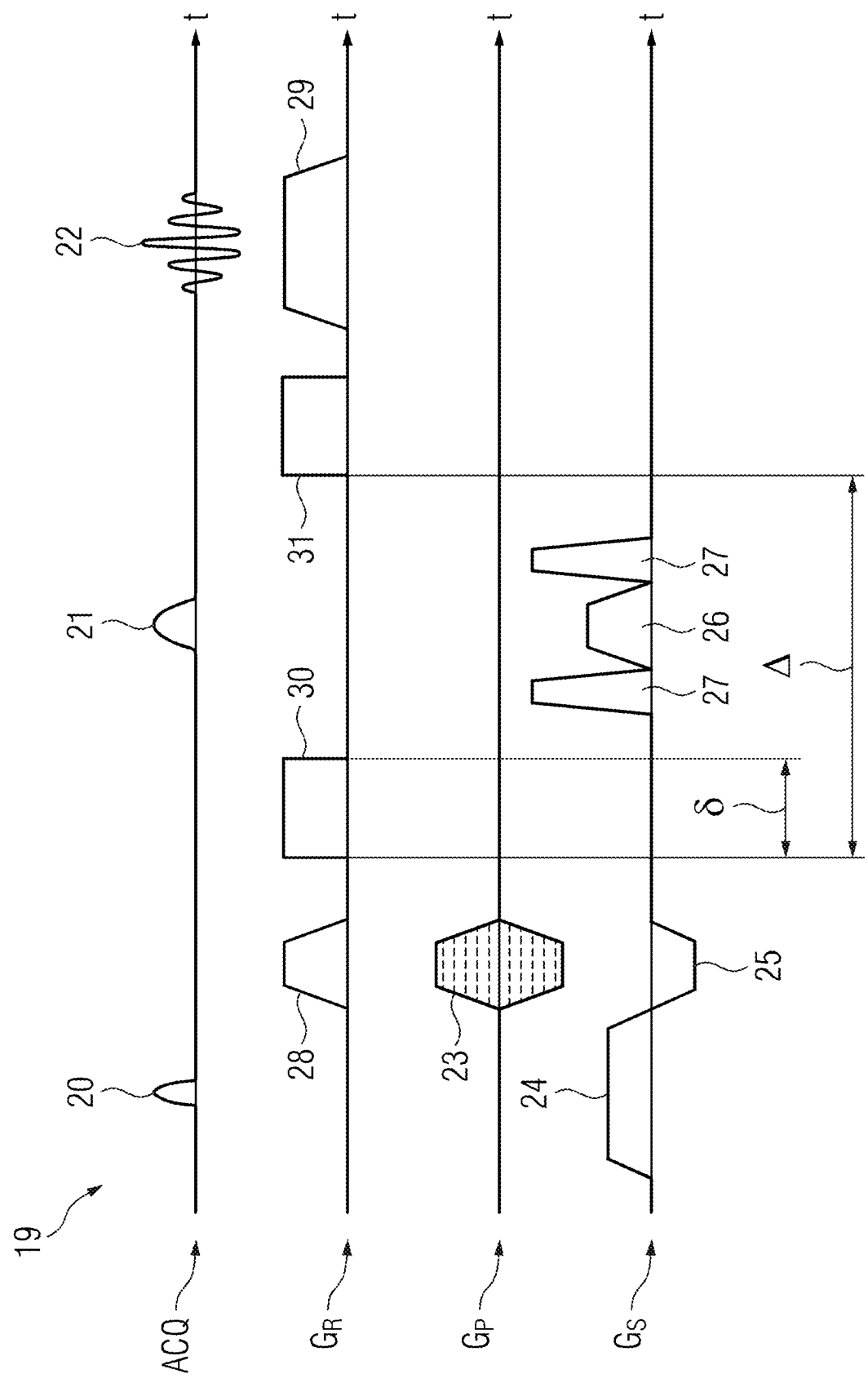
FIG. 4 depicts an example of a DW-SE sequence diagram.

FIG. 4 depicts a sequence diagram 19 of a DW-SE scan sequence.

The DW-SE scan sequence has, as a high frequency pulse shown on the acquisition (ACQ) axis, an excitation pulse 20, and a refocusing pulse 21. The excitation pulse may have a flip angle of 90° and a refocusing pulse of 180°. The excitation pulse 20 and the refocusing pulse 21 together generate a spin echo as the echo signal 22.

In the phase encoding direction $G_p$, the phase encoding gradient 23 is applied.

In the slice selection direction $G_s$, apart from the slice selection gradients 24 and the slice rephasing gradients 25, there is also a slice selection gradient 26 for the refocusing pulse 21 and crusher gradients 27.

The slice rephasing gradient 25 rephases the magnetization which has been dephased by the slice selection gradients 24. Its gradient moment may be half the size of that of the slice selection gradient 25.

The crusher gradients 27 may also be configured such that they are linked to the slice selection gradients 26 without gradient ramps. This combined gradient has a shape like, for example, the slice selection gradient 24, but is longer. By the crusher gradients 27, all the portions of the magnetization which were not refocused by 180° are destroyed. They may alternatively or additionally also be applied in the reading direction $G_R$ or the phase encoding direction $G_P$.

In the reading direction $G_r$, both the reading dephasing gradient 28, the reading gradient 29 and also the diffusion gradient 30 and 31 are applied.

By the diffusion gradients 30 and 31, a b-value of $b=g^2G^2d^2(D-d/3)$ is generated as described above. These are idealized with perpendicular gradient ramps, as assumed in the calculation of the b-value. In reality, the ramps naturally have a slope.

The reading-dephasing gradient 28 and/or the phase encoding gradient 23 may also be arranged directly before the readout gradient 29, but as known, with a changed polarity.

For carrying out the method described, on the z-gradient, the reading direction $G_r$ may be placed in the z-direction as shown in FIG. 1. The phase encoding direction $G_p$ may be placed in the x-direction and the slice selection direction $G_s$ in the y-direction. An arrangement as shown in FIG. 5 is then obtained.

Figure 5:
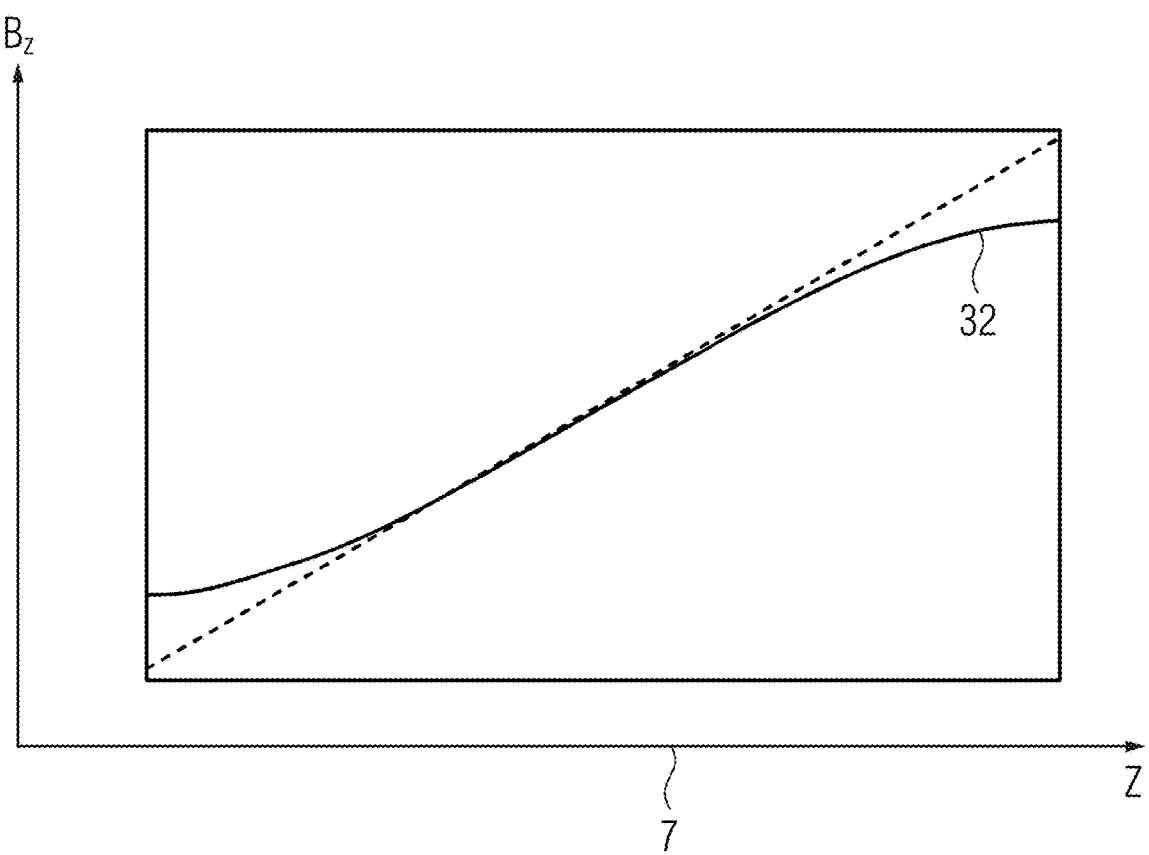
FIG. 5 depicts an example of a representation of the non-linearity of a magnetic field gradient.

FIG. 5 is an exemplary representation of the non-linearity of a magnetic field gradient. The gradient field 32 to be tested lies in the z-direction. The ordinates of the gradient field represents a magnetic field amplitude. Variations of the gradient field may lie not only in the z-direction, but also along the x-axis (not shown).

The phase encoding direction $G_p$ lies in the x-direction and the slice selection direction $G_s$ lies in the y-direction.

The dashed line shows a linear form, whereas the real gradient field 32 is flattened at the edges of the visual field. The frame surrounding the gradient field 32 shows the field of view of an image data set to be recorded, e.g. the image data set 36.

In order to be able to calculate a map of apparent diffusion coefficients, a second image data set with a different b-value is to be recorded. For the sake of simplicity, the sequence according to FIG. 4 may be run again, whereby the diffusion gradients are set to 0. The echo time and other parameters remain unaffected.

Figure 6:
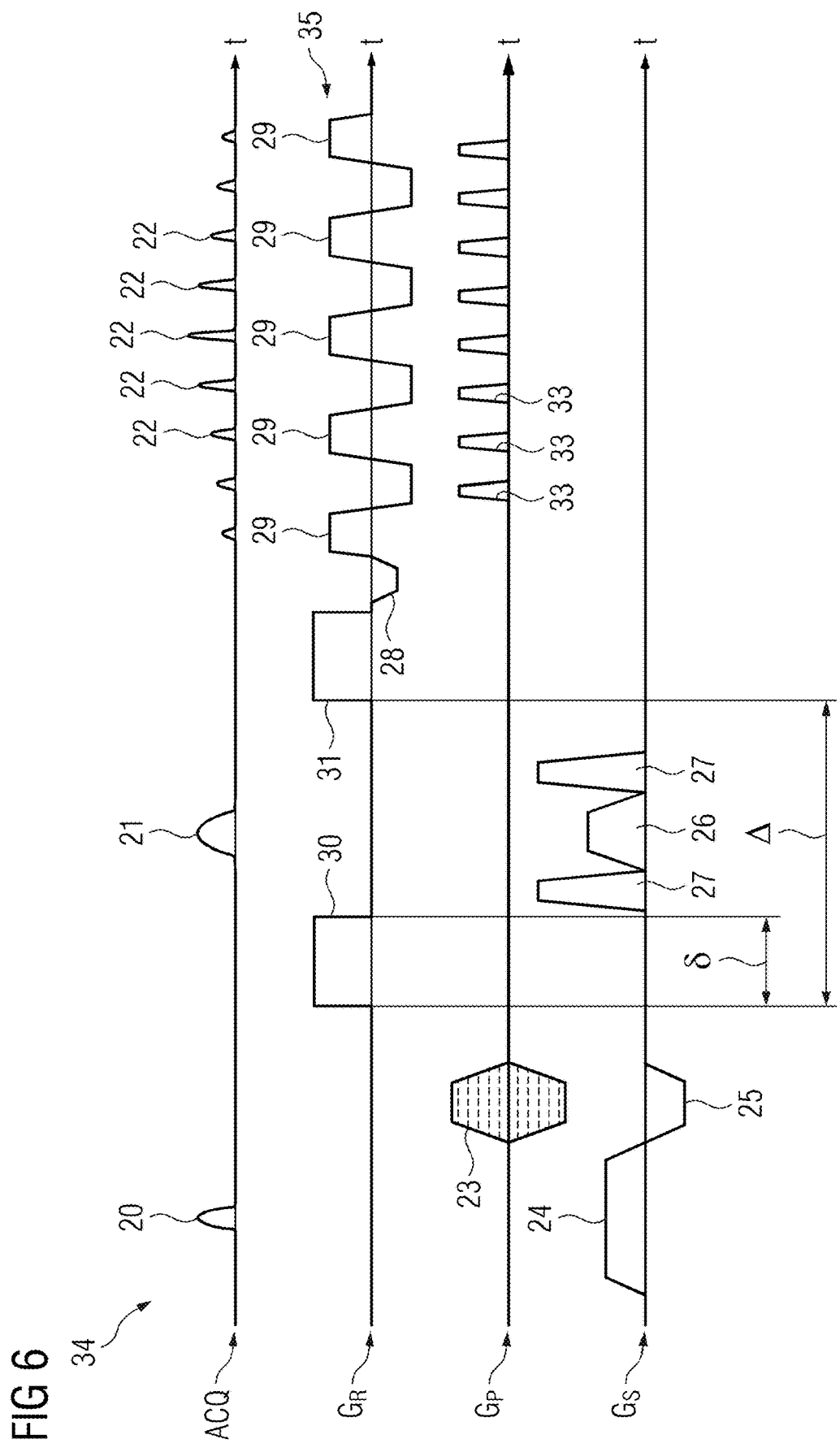
FIG. 6 depicts an example of a DW-EPI sequence diagram.

In order to accelerate the image generation, in place of the DW-SE shown in FIG. 4, a sequence diagram 34 of a DW-EPI shown in FIG. 6 may be used. This matches the DW-SE in many parts, so that reference is made to the description relating thereto.

As distinct from DW-SE, however, in place of an individual echo signal 22, a gradient echo train 35 for generating a plurality of echo signals 22 is used. In particular, all the necessary k-space rows may be recorded as single shot-EPIs.

For phase encoding, so-called gradient blips 33 are also used. This involves constant gradient moments which bring about the predetermined phase change.

A further reduction of the scan time may be obtained by using a receiving coil array.

Figure 7:
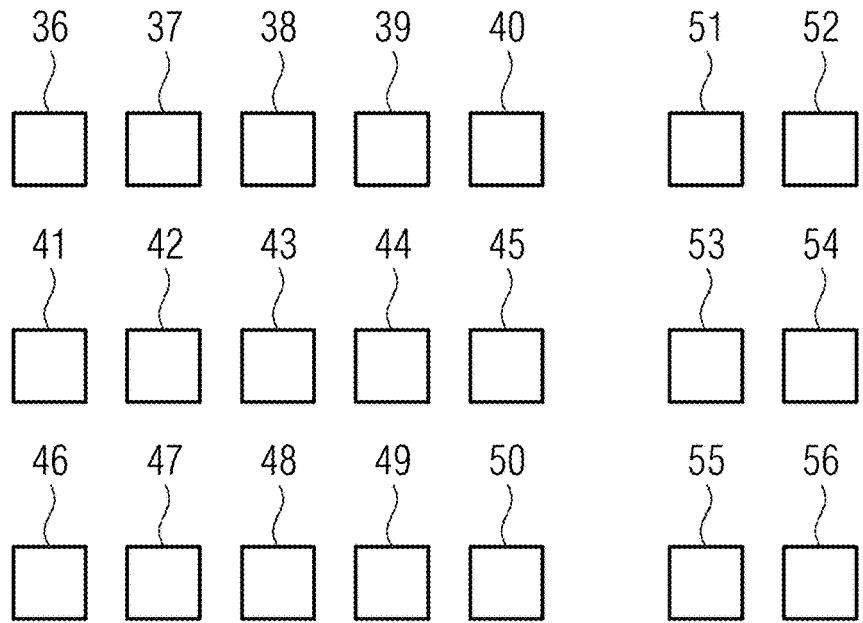
FIG. 7 depicts an overview.

FIG. 7 depicts an overview for carrying out the method described.

In the exemplary method, the image data sets 36, 37, 38, 39, and 40 are recorded on the magnetic resonance system 1. The image data set 36 may be recorded as shown in FIG. 4. When the image data set 37 is recorded, the diffusion gradients are set to 0. During the recording of the image data set 38, the polarity of the gradients is swapped as compared with the image data set 36. The image data sets 39 and 40 correspond to the image data sets 36 and 37, wherein the reading direction $G_r$ and the phase encoding direction $G_p$ were swapped as compared with the image data sets 36 and 37. The diffusion gradients are each applied in the z-direction, as also in the image data sets 36 to 38 of the reading gradient. In the image data sets 39 and 40, the reading gradient lies in the x-direction. The slice selection gradient lies in the y-direction.

The image data sets 41 to 45 are subject to the same scheme, whereby here the gradient field is investigated in the y-direction. Accordingly, the diffusion gradients lie in the y-direction. The reading gradient direction $G_r$ then lies, in the first three image data sets 41, 42 and 43, in the y-direction and, in the image data sets 44 and 45, in the z-direction. The phase encoding direction $G_p$ only then lies in the z-direction and thereafter in the y-direction. The slice selection takes place in the x-direction.

For control of the gradient field in the x-direction, a similar process is used: the diffusion gradients lie in the x-direction. The reading gradient direction $G_r$ then lies, in the first three image data sets 46, 47 and 48, in the x-direction and, in the image data sets 49 and 50, in the y-direction. The phase encoding direction $G_p$ only then lies in the y-direction and thereafter in the x-direction. The slice selection takes place in the z-direction.

The image data sets 36 to 50 may be evaluated on the control apparatus 3 of the magnetic resonance system 1 or on an external computer. They are then transferred to this computer after the recording.

From the image data sets 36 to 40, a first map 51 of apparent diffusion coefficients is created. Thereby, spherical surface functions may be fitted to the diffusion coefficients. As reference values for the apparent diffusion coefficients obtained thereby, a map 52 is used which was generated at an earlier time point, for example, during the commissioning of the magnetic resonance system 1, with the same recording and evaluating parameters. If the deviations exceed a predetermined threshold value, the gradient fields are scanned again. Then, the map 51 may be used as a new reference map.

The same procedure leads, for the image data sets 41 to 45, to a map 53 of apparent diffusion coefficients which are compared with a reference map 54. The image data sets 46 to 50 result in a map 55 of apparent diffusion coefficients which are compared with a reference map 56.

Naturally, the image data sets 36 to 50 are recorded as so-called raw data sets which are to be at least Fourier transformed for generating an image. On which computer the reconstruction of the image data sets takes place is unimportant.

In order to keep the evaluation simple, at least two different diffusion-weighted image data sets are to be created for each gradient direction that is to be monitored. If it is wished to check only the z-direction, then only the provision of the image data sets 36 and 37 is necessary for the execution of the method. The recording of the image data sets itself may be an act preceding the method.

At least for a DW-EPI recording, the image data set recorded with a b-value of 0 may also be repeated with a swapped phase encoding direction. In this way, the influence of undesirable side-effects such as, for example, distortions from $B_0$-inhomogeneities on the ascertaining of the ADC maps may be reduced.

An exemplary list of combinations for the investigation of the y-gradient field shows the position of the gradient coordinate system with the slice selection direction $G_S$, the readout direction $G_R$ and the phase encoding direction $G_P$ in respect of the device coordinate system with the directions x, y and z:

$$G_S=x, G_R=y, G_P=z$$

$$G_S=x, G_R=z, G_P=y$$

$$G_S=z, G_R=y, G_P=x$$

$$G_S=z, G_R=x, G_P=y$$

Each is recorded with:
b=0
b!=0, first polarity of the y-diffusion gradients
b!=0, second polarity of the y-diffusion gradients wherein the operator != indicates a value not equal to 0.

All in all, a maximum of 12 scans are to be recorded, of which at least two with different b-values are absolutely necessary.

Figure 8:
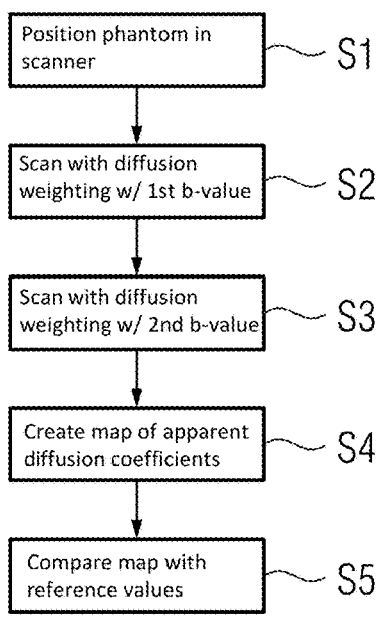
FIG. 8 depicts a flow diagram of an example of a method for ascertaining a deviation of a gradient field of a magnetic resonance system from a reference.

FIG. 8 depicts a flow diagram of a method for ascertaining a deviation of a gradient field of a magnetic resonance system from a reference.

In act S1, a phantom 16 with isotropic diffusion properties is positioned in the scanner 2. The phantom 16 may be, for example, a spherical or cylindrical hollow body filled with water or other liquid with isotropic diffusion properties. The phantom may be positioned so that it includes the spatial region of the gradient field to be tested, in particular, a region to be tested for non-linearity. If a plurality of regions are to be acquired, a plurality of scans may be carried out with different positioning of the phantom.

Thereby, a positioning aid may be used in order to achieve a defined positioning of the phantom.

Through the use of local receiving coils, that is, a receiving coil array, the SNR (signal-to-noise ratio) may thus be increased and/or the scan time may be shortened. In principle, however, the whole-body coil may be used as the receiving coil.

In act S2, a scan is to be carried out with diffusion weighting along the gradient field direction to be tested, with a first b-value, (e.g., one of the image data sets denoted as image data set 36, 41, or 46 in FIG. 7 is to be recorded).

For example, the physical x-, y-, and z-axes of the gradient coils may be scanned one after another. The method may however equally be applied to any desired overlaying of physical directions or to gradient coil arrays, that is, gradient systems with more than three independent channels. For example, b=0 may be selected as the first b-value. However, the method also functions with other selections of the values, provided diffusion coefficients may be ascertained from the scans.

As the scanning method, any diffusion-weighted scan which permits the ascertaining of diffusion coefficients may be used. For example, a diffusion-weighted echoplanar imaging may also be used in clinical routine—as a single shot or a segmented method.

In act S3, a scan is to be carried out with diffusion weighting along the same gradient field direction with a second b-value, (e.g., one of the image data sets denoted as image data set 37, 42, or 47 in FIG. 7 is to be recorded).

The at least one second b-value may differ from the first to the extent that a reliable ascertainment of the apparent spatial variations of the diffusion coefficient is possible. For this, the first and the second b-value differ by at least 10 s/mm$^2$, or by more than 100 s/mm$^2$. As the second b-value, for example, a value in the range [e.g., 100 s/mm$^2$, 2000 s/mm$^2$] may be selected. Depending upon the liquid used and the main field strength, the selection of the parameters may be different in order to optimize the sensitivity of the method. Of decisive importance ultimately are a) the SNR and b) a sufficient difference of the signal strength brought about by diffusion effects.

Acts S1 to S3 are to be carried out on the magnetic resonance system 1 and acts S4 and S5 may be carried out on any computers.

In act S4, a map of apparent diffusion coefficients is created.

The signal amplitude of a diffusion-weighted scan is described by S(b)=S0 exp(-b ADC). From two scans of the signal S(b) with at least two different and known values of the assumed b-value, an apparent diffusion coefficient ADC may be ascertained for each image element analytically or by regression methods.

Because the liquid has an isotropic diffusion behavior, variations in the ascertained ADC map are attributable to spatial deviations of the actual local b-value. The latter are caused by the non-linearities of the gradient system.

In act S5, the ADC map is compared with reference values. The acts S1 to S4 are repeated at different time points in order to align the ADC maps then obtained with the initially created ADC map. A comparison of the spatial distribution of the ADC with that of the reference scan permits temporal variations of the non-linearity of the tested gradient field to be detected.

For example, the ADC maps ascertained at different time points may be subtracted from one another. Variations in the difference map indicate a change in the gradient field, in particular, non-linearities.

Dependent upon the liquid, the actual diffusion coefficient may dependent upon the temperature. In order to eliminate this influence, the ADC maps may be normalized before or after the subtraction. The normalization may take place at a defined location, for example, the isocenter of the magnet.

Through the setting of limit values, a criterion may be defined for a sufficient stability of the non-linearity. For example, a linearity deviation of +/−1% or +/−5% may be defined as sufficient. Therefrom, for example, for the diffusion encoding with two identical rectangular gradient pulses of amplitude G and duration d at the spacing D, a permissible deviation of the actual local b-value may be calculated according to b=g$^2$ (D−d/3). Finally, a limit may thereby be ascertained for the spatial variation of the difference ADC maps. Through spatial filtration, for example, with a Gaussian filter or by adaptation of model functions, (e.g., spherical surface functions), where needed, the noise in the ADC maps or in the difference map may be reduced in order to ascertain reliably the variations of non-linearities, e.g., on relatively large length scales.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the disclosure has been illustrated and described in detail with the help of the disclosed embodiments, the disclosure is not limited to the disclosed examples. Other variations may be deducted by those skilled in the art without leaving the scope of protection of the claimed disclosure.

The invention claimed is:

1. A method for ascertaining a deviation of at least one gradient field of a magnetic resonance system from a reference, the method comprising:
   providing a first image data set and a second image data set of a phantom with isotropic diffusion properties, recorded with a diffusion-weighted imaging sequence, wherein the first image data set and the second image data set are recorded with different diffusion-weightings along a gradient direction to be tested of the gradient field using the magnetic resonance system;
   ascertaining a map of apparent diffusion coefficients from the first image data set and the second image data set for at least a portion of image points of the first image data set and the second image data set; and
   comparing the apparent diffusion coefficients with reference values.

2. The method of claim 1, wherein the diffusion weightings are obtained by diffusion gradients along the gradient direction to be tested.

3. The method of claim 1, wherein the providing, the ascertaining, and the comparing are repeated for a second gradient direction and/or a third gradient direction.

4. The method of claim 1, wherein a first diffusion-weighted imaging sequence with which the first image data set has been recorded has a b-value in a range of 100 s/mm$^2$ and 2000 s/mm$^2$.

5. The method of claim 4, wherein a second diffusion-weighted imaging sequence with which the second image data set has been recorded has a b-value which differs by at least 100 s/mm$^2$ from the b-value of the first diffusion-weighted imaging sequence.

6. The method of claim 1, wherein a second diffusion-weighted imaging sequence with which the second image data set has been recorded has a b-value which differs by at least 100 s/mm$^2$ from a b-value of a first diffusion-weighted imaging sequence with which the first image data set has been recorded.

7. The method of claim 1, wherein, in the diffusion-weighted imaging sequence, diffusion gradients are arranged symmetrically round a refocusing pulse.

8. The method of claim 1, wherein diffusion gradients are configured eddy current-compensated.

9. The method of claim 1, further comprising:
   providing at least one additional image data set, wherein in a portion of the first image data set, the second image data set, and the at least one additional image data set, a polarity of diffusion gradients is swapped.

10. The method of claim 1, wherein the diffusion-weighted imaging sequence for the recording of the first image data set and the second image data set has a refocusing pulse, and
   wherein a slice thickness of an excited magnetization is greater than in an excitation pulse.

11. The method of claim 1, wherein the reference values are maps of apparent diffusion coefficients recorded at an earlier time point with the magnetic resonance system.

12. The method of claim 11, wherein the maps of the apparent diffusion coefficients are recorded with the diffusion-weighted imaging sequence.

13. The method of claim 1, wherein the maps of the apparent diffusion coefficients are normalized before the comparing of the apparent diffusion coefficients.

14. The method of claim 1, further comprising:
   providing a third image data set and a fourth image data set, wherein in a portion of the first image data set, the second image data set, the third image data set, and the fourth image data set, directions of phase encoding gradients and readout gradients are swapped.

15. A computer program product for a control apparatus for controlling a computer of a magnetic resonance system, wherein the computer program product, when executed by the control apparatus, is configured to cause the computer to:
   provide a first image data set and a second image data set of a phantom with isotropic diffusion properties, recorded with a diffusion-weighted imaging sequence, wherein the first image data set and the second image data set are recorded with different diffusion-weightings along a gradient direction to be tested of a gradient field using the magnetic resonance system;
   ascertain a map of apparent diffusion coefficients from the first image data set and the second image data set for at least a portion of image points of the first image data set and the second image data set; and
   compare the apparent diffusion coefficients with reference values.

16. The computer program product of claim 15, wherein the computer is an image generating unit or an evaluating unit of the magnetic resonance system.

17. A magnetic resonance system comprising:
   a control apparatus configured to:
   provide a first image data set and a second image data set of a phantom with isotropic diffusion properties, recorded with a diffusion-weighted imaging sequence, wherein the first image data set and the second image data set are recorded with different diffusion-weightings along a gradient direction to be tested of a gradient field using the magnetic resonance system;
   ascertain a map of apparent diffusion coefficients from the first image data set and the second image data set for at least a portion of image points of the first image data set and the second image data set; and
   compare the apparent diffusion coefficients with reference values.

* * * * *